US009184265B2

(12) United States Patent
Lai et al.

(10) Patent No.: US 9,184,265 B2
(45) Date of Patent: *Nov. 10, 2015

(54) METHODS AND APPARATUS FOR BIPOLAR JUNCTION TRANSISTORS AND RESISTORS

(71) Applicant: Taiwan Semiconductor Manufacturing Company, Ltd., Hsin-Chu (TW)

(72) Inventors: Jui-Yao Lai, Yuanlin Township (TW); Yen-Ming Chen, Chu-Pei (TW); Shyh-Wei Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/486,405

(22) Filed: Sep. 15, 2014

(65) Prior Publication Data
US 2015/0035012 A1    Feb. 5, 2015

Related U.S. Application Data

(63) Continuation of application No. 13/471,223, filed on May 14, 2012, now Pat. No. 8,853,826.

(51) Int. Cl.
H01L 21/02 (2006.01)
H01L 29/737 (2006.01)
H01L 29/66 (2006.01)
H01L 29/8605 (2006.01)
(Continued)

(52) U.S. Cl.
CPC ............ *H01L 29/737* (2013.01); *H01L 21/265* (2013.01); *H01L 21/283* (2013.01); *H01L 29/165* (2013.01); *H01L 29/66166* (2013.01);
(Continued)

(58) Field of Classification Search
CPC ............ H01L 21/8249; H01L 21/8248; H01L 27/0262; H01L 27/1022; H01L 29/0823; H01L 29/0804; H01L 29/0817; H01L 29/0821; H01L 29/41708; H01L 29/66234; H01L 29/66166; H01L 29/8605; H01L 29/0649; H01L 29/66242; H01L 29/7378; H01L 2924/1305
USPC .......... 438/189, 235, 309; 257/197, 273, 477, 257/526, 565, 586–592, E31.069, E29.033
See application file for complete search history.

(56) References Cited

U.S. PATENT DOCUMENTS

2006/0252216 A1    11/2006    Dokumaci et al.
2007/0134854 A1     6/2007    Zhang et al.
(Continued)

FOREIGN PATENT DOCUMENTS

TW    200400593    1/2004
TW    200501395    1/2005

*Primary Examiner* — Brook Kebede
(74) *Attorney, Agent, or Firm* — Slater & Matsil, L.L.P.

(57) ABSTRACT

Methods and apparatus for bipolar junction transistors (BJTs) are disclosed. A BJT comprises a collector made of p-type semiconductor material, a base made of n-type well on the collector; and an emitter comprising a p+ region on the base and a SiGe layer on the p+ region. The BJT can be formed by providing a semiconductor substrate comprising a collector, a base on the collector, forming a sacrificial layer on the base, patterning a first photoresist on the sacrificial layer to expose an opening surrounded by a STI within the base; implanting a p-type material through the sacrificial layer into an area of the base, forming a p+ region from the p-type implant; forming a SiGe layer on the etched p+ region to form an emitter. The process can be shared with manufacturing a polysilicon transistor up through the step of patterning a first photoresist on the sacrificial layer.

20 Claims, 9 Drawing Sheets

(51) Int. Cl.
  *H01L 21/265* (2006.01)
  *H01L 21/283* (2006.01)
  *H01L 29/165* (2006.01)
  *H01L 29/06* (2006.01)

(52) U.S. Cl.
  CPC ...... *H01L 29/66242* (2013.01); *H01L 29/7378* (2013.01); *H01L 29/8605* (2013.01); *H01L 29/0649* (2013.01)

(56) References Cited

U.S. PATENT DOCUMENTS

| | | | |
|---|---|---|---|
| 2008/0067601 A1* | 3/2008 | Chen | 257/361 |
| 2008/0087918 A1 | 4/2008 | Arendt | |
| 2010/0301453 A1* | 12/2010 | Chung et al. | 257/574 |
| 2011/0169137 A1 | 7/2011 | Lin et al. | |
| 2012/0032303 A1 | 2/2012 | Elkareh et al. | |
| 2013/0299944 A1 | 11/2013 | Lai et al. | |

* cited by examiner

METHODS AND APPARATUS FOR BIPOLAR JUNCTION TRANSISTORS AND RESISTORS

PRIORITY CLAIM AND CROSS-REFERENCE

This application is a continuation of copending U.S. patent application Ser. No. 13/471,223, entitled "Methods and Apparatus for Bipolar Junction Transistors and Resistors," filed on May 14, 2012, which application is hereby incorporated by reference.

BACKGROUND

Semiconductor devices used for many applications may comprise millions of transistors or other devices such as resistors. There are many different types of transistors. A complementary metal oxide semiconductor ("CMOS") device comprises metal-oxide semiconductor field-effect transistors ("MOSFET"). Bipolar junction transistors ("BJTs"), either NPN BJTs or PNP BJTs, may be used to make other types of transistors. A MOSFET utilizes a NPN and a PNP BJT may be used in various applications.

BJTs generally exhibit higher gain, higher frequency performance and lower noise compared to MOSFETs. BJTs may also be classified as lateral or vertical BJTs. A BJT typically includes an emitter, a collector, and a base. The collector is formed on a semiconductor substrate between a pair of shallow trench isolation (STI) regions, which electrically isolates the collector of the BJT from other devices located in the substrate. The base is located above the collector but underneath the emitter. The BJTs may be formed using CMOS technology, and may be formed simultaneously with other CMOS devices such as resistors.

Resistors may be formed by any type of resistive material and used as load devices within a variety of semiconductor devices. Polysilicon resistors are made of a thin layer of either intrinsic or low-doped polycrystalline silicon, which can result in a significant reduction in the device size and a high integration density.

In recent years, submicron technology for CMOS devices has made it possible to attain higher speed and performance. Similar progress is desired for BJTs formed using a silicon substrate. In particular, the silicon germanium (SiGe) BJTs have been considered highly promising, where SiGe has a narrower bandgap than silicon so as to form a hetero-junction. In the hetero-junction structure, the emitter can inject charge carriers with greater efficiency into the base. However, PNP BJT with a SiGe hetero-junction emitter has a very poor performance. Therefore, there is a need for improving the performance for SiGe BJTs.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

As will be illustrated in the following, methods and apparatus for bipolar junction transistors (BJTs) are disclosed. The emitter of the BJT device comprises a p+ region and a SiGe layer above the p+ region, which can dramatically improve the PNP BJT performance. The method for implanting p+ material and forming the p+ region under the SiGe layer to form an emitter of the BJT has low cost since it can share process steps up through a photoresist step with the formation of polysilicon resistors of a same system.

Figure 1A:
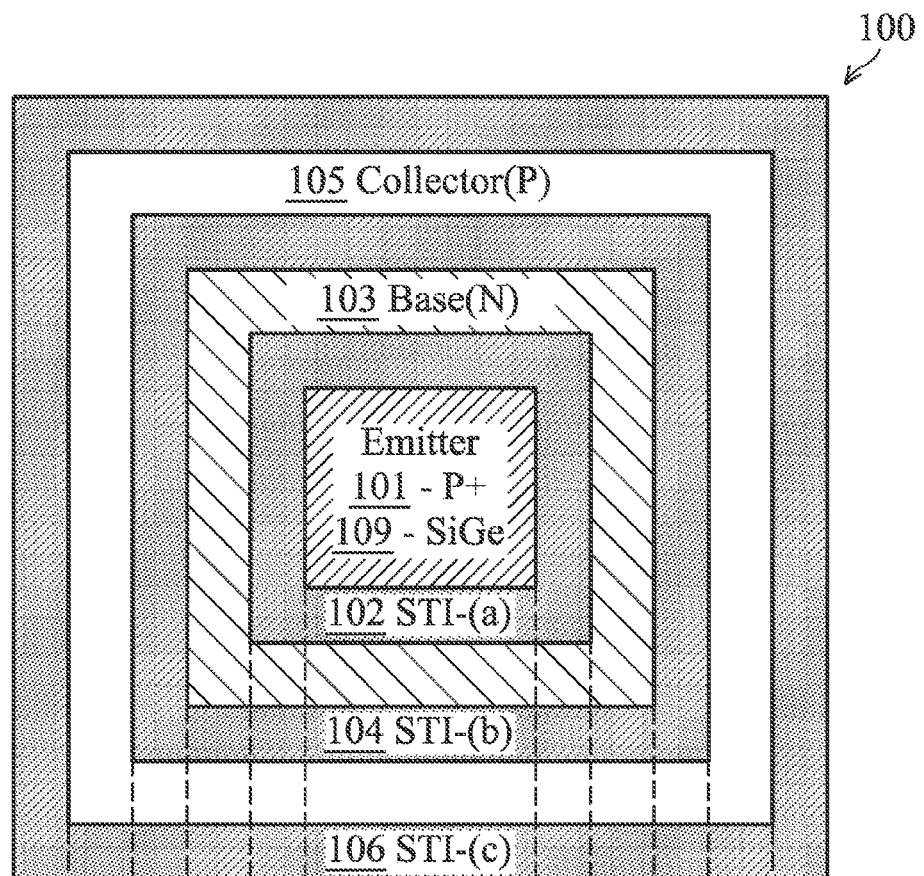
FIGS. 1(a) and 1(b) illustrate a top view and a cross-section view of an exemplary PNP vertical bipolar junction transistor (BJT)
Figure 1B:
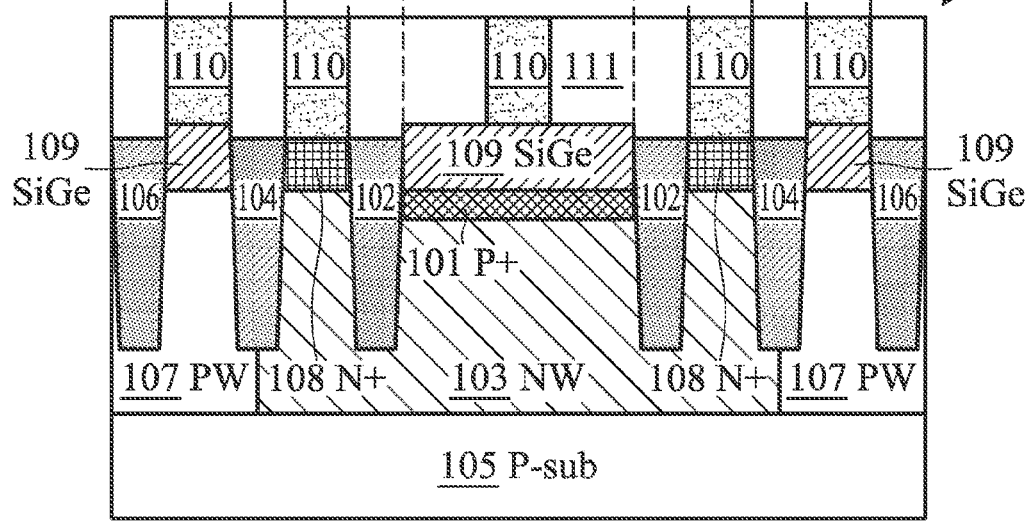

FIG. 1(a) illustrates an exemplary embodiment of a PNP vertical bipolar junction transistor (BJT) 100 in a top view. FIG. 1(b) illustrates the same embodiment of the PNP BJT 100 in a cross-section view. A same numeral is used to refer to the same component of the BJT either in a top view as shown in FIG. 1(a) or in a cross-section view as shown in FIG. 1(b).

As illustrated in FIGS. 1(a) and 1(b), a collector 105 is formed in a semiconductor substrate, which is not shown, and surrounded by an isolation region 106, which are shown as a pair of shallow trench isolation (STI) regions 106 in the cross-section view in FIG. 1(b). For the PNP BJT, the collector 105 is a p-type collector made of p-type semiconductor materials or p-type materials. The semiconductor substrate, not shown, may be an n-type substrate in a PNP BJT, which may be formed from any suitable type of semiconductor material, such as silicon. An n-doped well region 103 may be formed on the collector 105 serving as a base, which is made of n-type semiconductor material or n-type material. The emitter comprises a p+ region 101 and a SiGe layer 109 formed on the p+ region 101. The p+ region 101 is a region where p-type impurities are doped under a high concentration and an n+ region is a region where n-type impurities are doped under a high concentration. When proper voltages are applied, charge carriers are emitted from the SiGe layer 109 and the p+ region 101 of the emitter, through the base 103, and injected into the collector 105. The collector 105, the base 103, and the emitter comprising p+ region 101 and SiGe layer 109 are all separated by isolation areas STIs 106, 104, and 102, respectively. Those isolation areas are shown in FIG. 1(b) as a pair of STIs such as a pair of STIs 106, 104, and 102.

The STIs 106, 104, and 102 may be oxide regions formed using a STI process; however, STIs 106, 104, and 102 may be formed using other methods and may be formed from any suitable type of dielectric material, such as other oxides or nitrides. The STI 102 is to separate the emitter from the base, the STI 104 is to separate the base from the collector, and the STI 106 is to separate the collector from other devices in the same system, which may be another BJT or some other devices.

As illustrated in FIG. 1(b), a first p-well 107 is formed on the collector 105 at a first side of the base 103 and a second p-well 107 is formed at a second side of the base 103. A first SiGe contact 109 is placed on the first p-well between the STI 104 and 106, and a second SiGe contact 109 is placed on the second p-well between the STI 104 and 106. Similarly, a first n+ contact 108 is formed on the base 103 placed on a first side of the emitter between the STI 102 and 104, and a second n+ contact 108 is placed on a second side of the emitter between the STI 102 and 104 on the base 103. An inter-level dielectric (ILD) layer 111 is on the emitter, the first n+ contact, the second n+ contact, the first SiGe contact, the second SiGe contact, and the STIs. A plurality of contacts 110 within the ILD 111 are connected to the emitter, the first n+ contact, the second n+ contact, the first SiGe contact, and the second SiGe contact, respectively. The ILD layer 111 may be made of an ultra-low dielectric constant material, which may be any material having a relatively weak mechanical strength. The BJT may further comprise a multi-level interconnect structure including multi-metal layers not shown.

FIGS. 2(a)-2(k) are cross-sectional views showing the processing steps in producing a PNP BJT 100 according to an embodiment such as the one shown in FIGS. 1(a)-1(b).

Figure 2A:
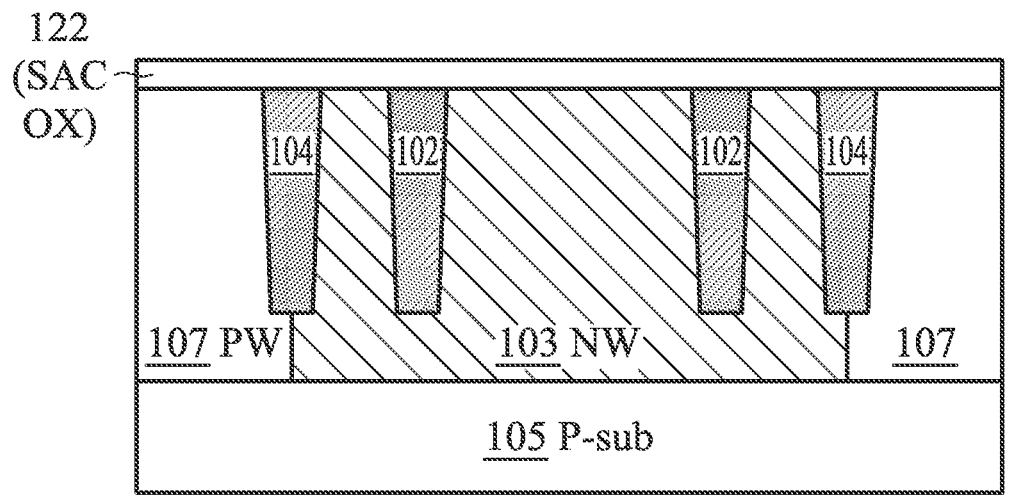
FIGS. 2(a)-2(k) are cross-sectional views showing the processing steps in manufacturing a PNP BJT according to an embodiment.

As illustrated in FIG. 2(a), a device has a collector 105 for the PNP BJT formed in a semiconductor substrate, not shown. The collector 105 is a p-type collector made of p-type materials. The collector 105 has an n-doped well region 103 formed on the collector 105 serving as a base, which is made of n-type semiconductor material or n-type material. A first p-well 107 is formed on a first side of the base 103 and a second p-well 107 is formed on a second side of the base. The first p-well 107 and the second p-well 107 are on the collector 105, on which contacts will be formed for the BJT in later process steps.

The collector 105 and the base 103 are separated by a pair of STIs 104. The STI 102s are formed surrounding an area where the emitter will be located. The BJT may further be surrounded by STIs not shown in FIG. 2(a). The STIs 102 and 104 are formed using a trench isolation process such as lithography, etching and filling of the trench with a trench dielectric material, such as other oxides or nitrides. The STI 102 is to separate the base from the emitter which is going to be formed, the STI 104 is to separate the base from the collector, and a STI may be used to separate the collector from other devices in the same system, which may be another BJT or some other devices.

A sacrificial oxide layer 122 may be formed on the base 103 and the STIs 102 and 104, the p-well 107, which are over the collector 105. The sacrificial oxide layer 122 is a protection layer for well implant performed later. A sacrificial oxide layer 122 may be formed by a process such as thermal oxidation.

Figure 2B:
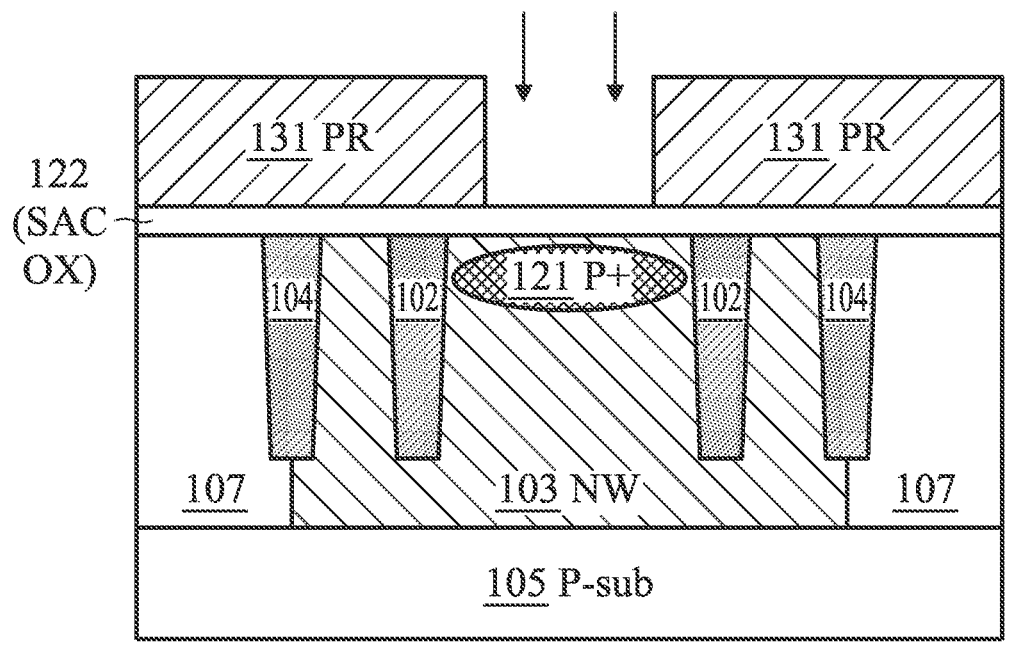

As illustrated in FIG. 2(b), a patterned photoresist 131 is formed over a partial area of the sacrificial oxide 122, leaving an area surrounded by the STI 102 to be exposed for further processing. The photoresist 131 and any other photoresist used herein, may be any known or later-developed photoresist material. The exposed area surrounded by the STI 102 is going to be used to form the emitter for the BJT.

A PNP emitter implant 121, which may be a p-type dopant, may be implanted through the sacrificial oxide layer 122 into an area of the base 103 not covered by the photoresist 131. The p-type material used here, and throughout this description, may be any known or later developed material for the p-type ion implantation, such as boron, boron fluoride, indium, or a combination of these materials. The p-type ion implantation forms an increases doping concentration of the emitter of the vertical PNP BJT.

Figure 2C:
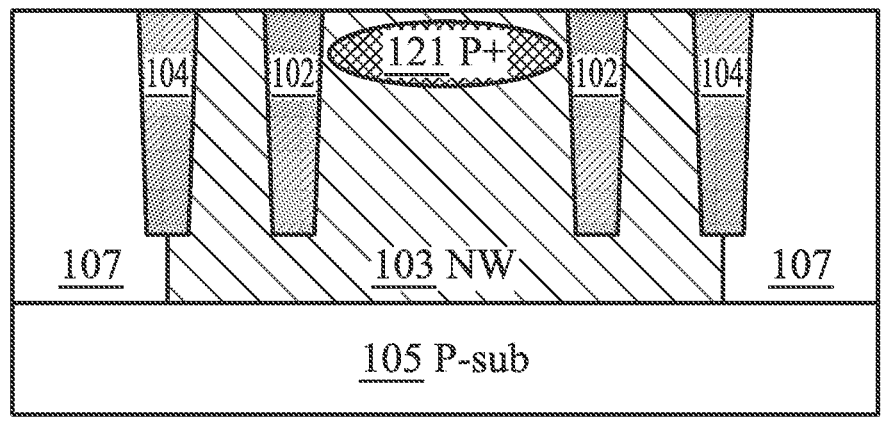

As illustrated in FIG. 2(c), the sacrificial layer 122 is removed, and the photoresist 131 is removed too. The photoresist 131 and the sacrificial layer 122 may be removed by a resist-stripping method such as by dry etching, wet etching or a combination thereof. The resist-stripping method stops at the base and the STI surface.

Figure 2D:
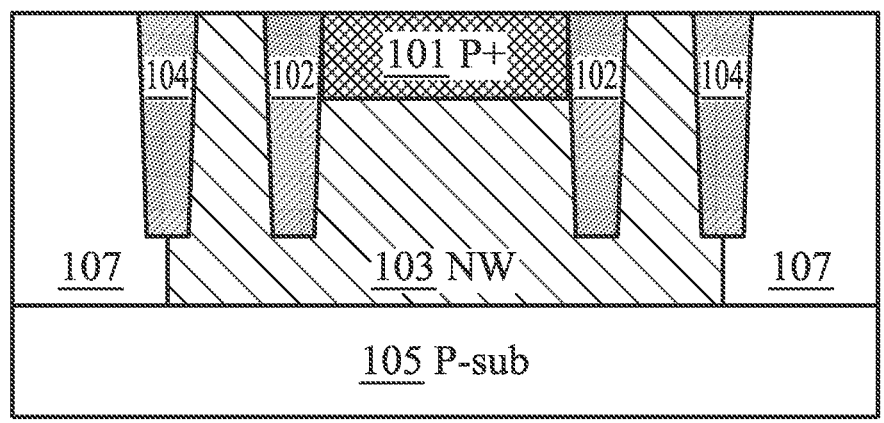

As illustrated in FIG. 2(d), a p+ region 101 is formed on the base 103 from the PNP emitter implant 121. The dopant 121 into the base 103 may form the p+ region 101 through a dopant diffusion process, such as a thermal growth furnace process or a rapid thermal annealing (RTA). The p+ region 101 has a thickness that may be in a range from about 10 nm to 60 nm. The range depends on the definition of boundary doping concentration, which may be 0.1 time of the peak concentration in an embodiment.

Figure 2E:
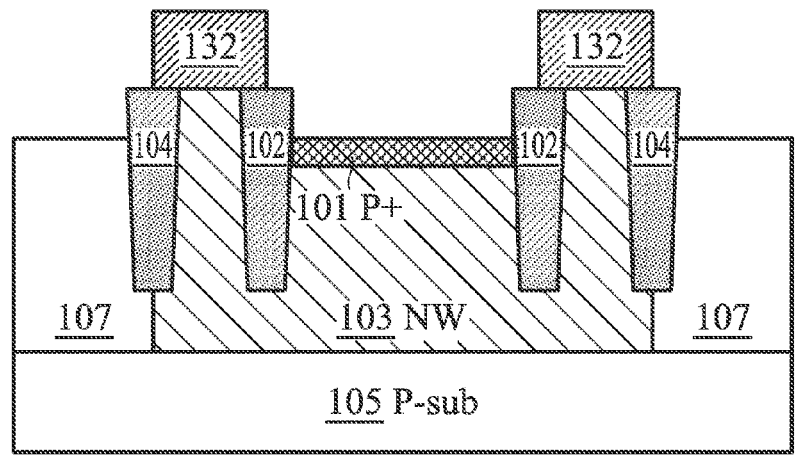

As illustrated in FIG. 2(e), the etching of the first p-well and the second p-well 107 and the p+ region 101 is performed, which may be done by a wet etch using Tetramethylammonium hydroxide (TMAH). A first mask layer 132 may be placed atop the base 103 and the STIs 102 and 104 to cover areas not to be etched. The first mask layer may be a hard mask layer such as an oxide or a SiN hard mask. Etching is done on the first p-well 107 at the first side of the base, the second p-well 107 at the second side of the base, and the p+ region 101 at the top portion of the base, not covered by the first mask.

Figure 2F:
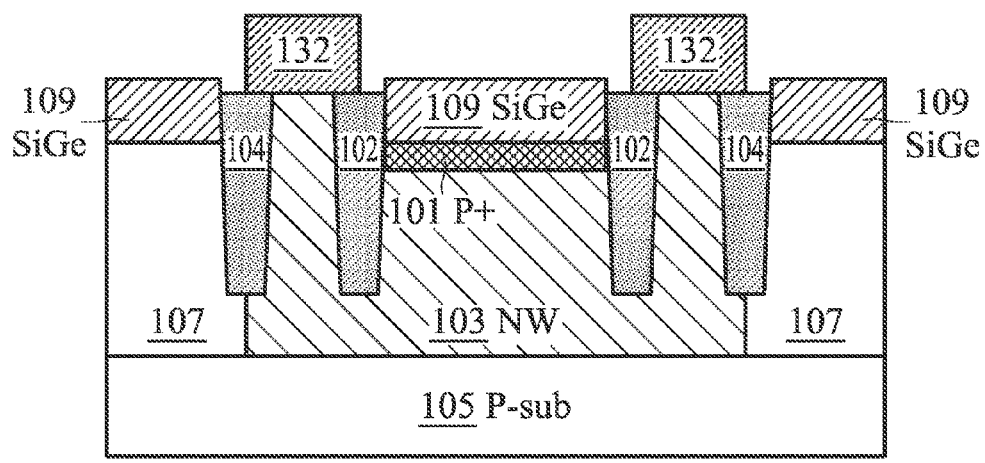

As illustrated in FIG. 2(f), a SiGe layer 109 is formed on areas that have been etched in step shown in FIG. 2(e). The SiGe layer 109 formed over the first p-well area 107 functions as the first SiGe contact 109 for the first p-well 107. The SiGe layer 109 formed over the second p-well 107 functions as the second SiGe contact 109. The p+ region 101 together with the SiGe layer formed over the p+ region 101 form the emitter for the BJT.

The SiGe layer may be formed by epitaxy. The SiGe layer 109 may be epitaxially grown at low temperature such as less than about 700° C. The SiGe layer 109 may be formed by selective epitaxial growth using conditions that are known to those skilled in the art. For example, a SiH4 precursor can be used as the silicon source and a GeH4 precursor can be used as the source of Ge. The concentration of Ge can be varied depending on the device requirement. The Si source precursor and the Ge source precursor may be diluted in hydrogen and growth of the SiGe layer 109 may occur at a temperature from about 500° C. to about 700° C. The thickness of the SiGe layer 109 may vary depending also on the device requirement. Typically, the SiGe layer 109 has a thickness from about 5 nm to about 60 nm.

Figure 2G:
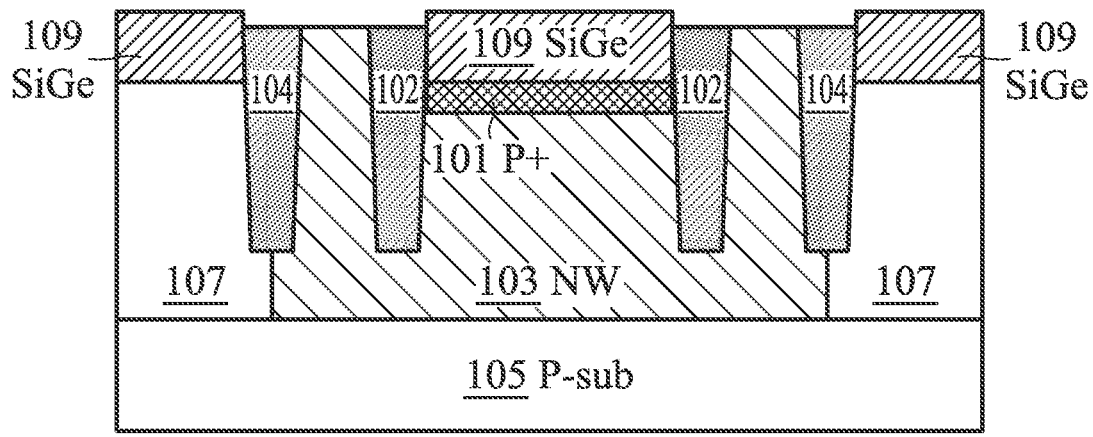
Figure 2H:
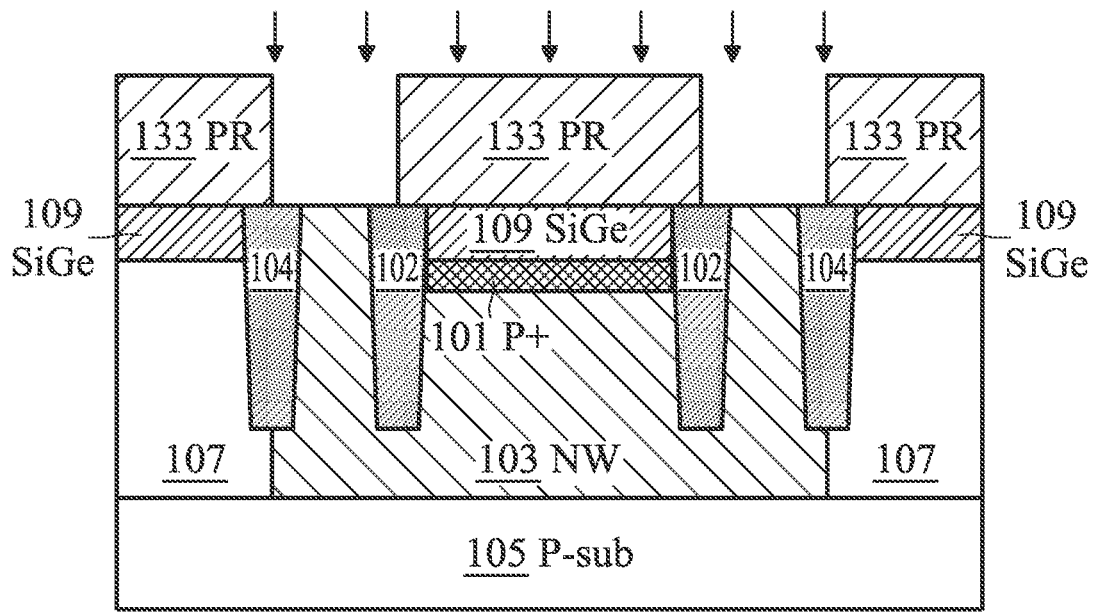

As illustrated in FIG. 2(g), the first mask such as an SiN hard mask 132 is removed so that further process can be performed. A second photoresist 133 may be formed on top of the SiGe layer 109 as shown in FIG. 2(h) so that n-type material may be implanted into the base. The second photoresist 133 is patterned on the SiGe layer to expose a first area of the base on a first side of the emitter not covered by the SiGe layer, and to expose a second area of the base on a second side of the emitter not covered by the SiGe layer. The n-type material used here may be any known or later developed material for the n-type ion implantation, such as arsenic, phosphorous, antimony, or a combination of these materials. The n-type material implanted forms a first n+ contact 108 on the first side of the emitter and a second n+ contact 108 on the first side of the emitter.

Figure 2I:
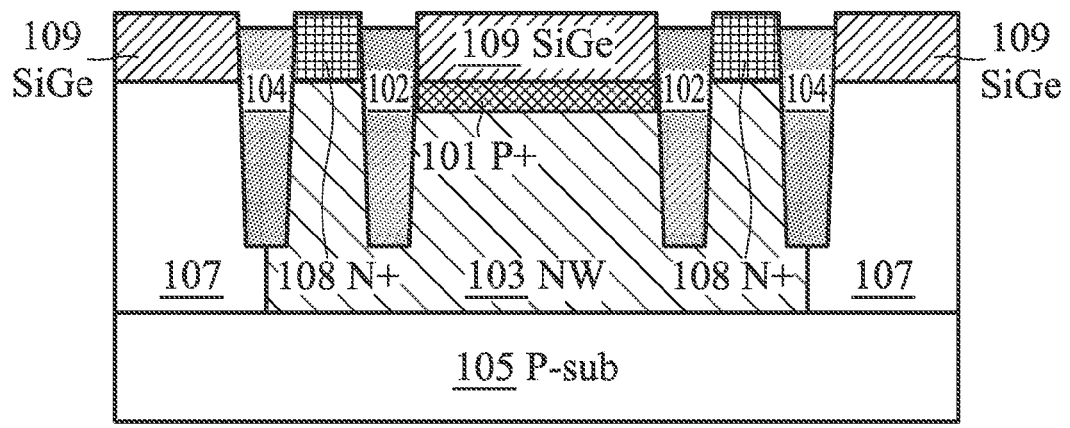

After the n-type implantation, the photoresist 131 may be removed by any resist-stripping method. The result is shown in FIG. 2(i) where the two n+ contacts 108 are formed over the base 103.

Figure 2J:
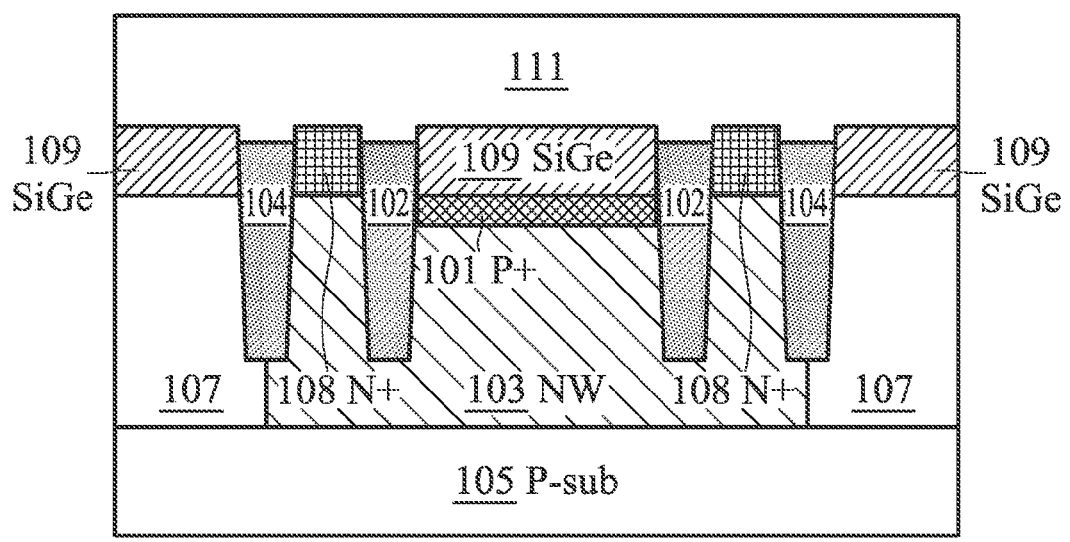

An inter-level dielectric (ILD) layer 111 may be formed on the surface of the device comprising the first SiGe contact 109, the second SiGe contact 109, the SiGe layer 109 of the emitter, the first n+ contact 108, the second n+ contact 108, as shown in FIG. 2(j). The ILD layer 111 may be made of an ultra-low dielectric constant material, which may be any material having a relatively weak mechanical strength.

Figure 2K:
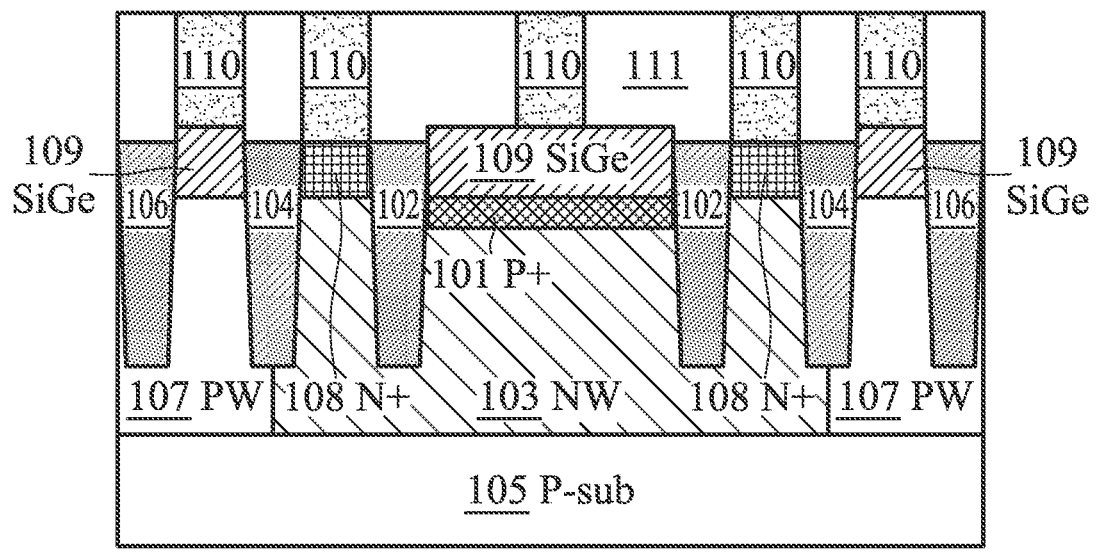

As illustrated in FIG. 2(k), a plurality of contacts 110 may be formed within the ILD layer 111 connected to the first SiGe contact, the second SiGe contact, the SiGe layer of the emitter, the first n+ contact, and the second n+ contact, respectively. The contacts 110 may be formed by steps such as contact etching, NiSi formation, and tungsten plug. The material NiSi or other silicide may be used as an interfacial layer to lower contact resistance. The BJT may further comprise a multi-level interconnect structure including multi-metal layers not shown.

The method illustrated in FIGS. 2(a)-2(k) forms a BJT device. The emitter of the so formed BJT comprises a p+ region 101 and a SiGe layer 109 above the p+ region, which can dramatically improve the PNP BJT performance. The method for implanting p+ material and forming the p+ region under the SiGe layer to form an emitter of the BJT has low cost since it can share process steps till a photoresist step with the formation of polysilicon resistors of a same system.

FIGS. 3(a)-3(d) are cross-sectional views showing exemplary processing steps in producing a polysilicon resistor according to an embodiment, where the processing steps till a photoresist step may be shared with the process of manufacturing a BJT when a system has both a BJT and a polysilicon resistor. Systems that contain both polysilicon resistors and BJTs may include bandgap behavioral circuits or bandgap reference circuits, which may be used in many analog circuits requiring voltage references, such as A/D and D/A converters. Polysilicon resistors are characterized by their sheet resistance values. In an effort to reduce the chip size, polysilicon resistors with high sheet resistance values are being fabricated in a small area.

Figure 3A:
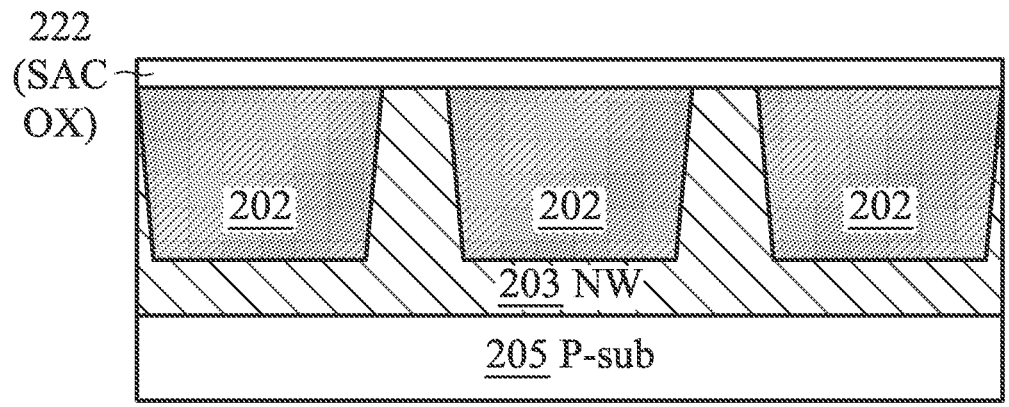
FIGS. 3(a)-3(d) are cross-sectional views showing the processing steps in manufacturing a polysilicon resistor according to an embodiment, where processing steps up through a photoresist step are shared with the process of manufacturing a BJT.

As illustrated in FIG. 3(a), a device has a p-type substrate 205 made of p-type materials. An n-doped well region 203 may be formed on the p-type substrate 205. One or a plurality of STIs 202 may be formed within the n-well 203, using a trench isolation process such as lithography, etching and filling of the trench with a trench dielectric material, such as other oxides or nitrides. The STI 202 is to separate the polysilicon resistor from other devices in the same system, which may be a BJT or some other devices. Three STIs 202 are shown in FIG. 3(a), which are only for illustration purposes and are not limiting. There may be one or any other number of STIs 202 in the n-well 203. The STIs 202 may be formed at the same time as those STIs 102 and 104 shown in FIG. 2(a), or they can be formed in a different time.

A sacrificial oxide layer 222 may be formed on the n-well 203 and the STIs 202. The sacrificial oxide layer 222 may be a protection layer for well implant performed later. The sacrificial oxide layer 222 may be formed by a process such as thermal oxidation. The sacrificial oxide layer 222 may be formed at the same time as the sacrificial oxide layer 122 shown in FIG. 2(a), or it can be formed in a different time.

Figure 3B:
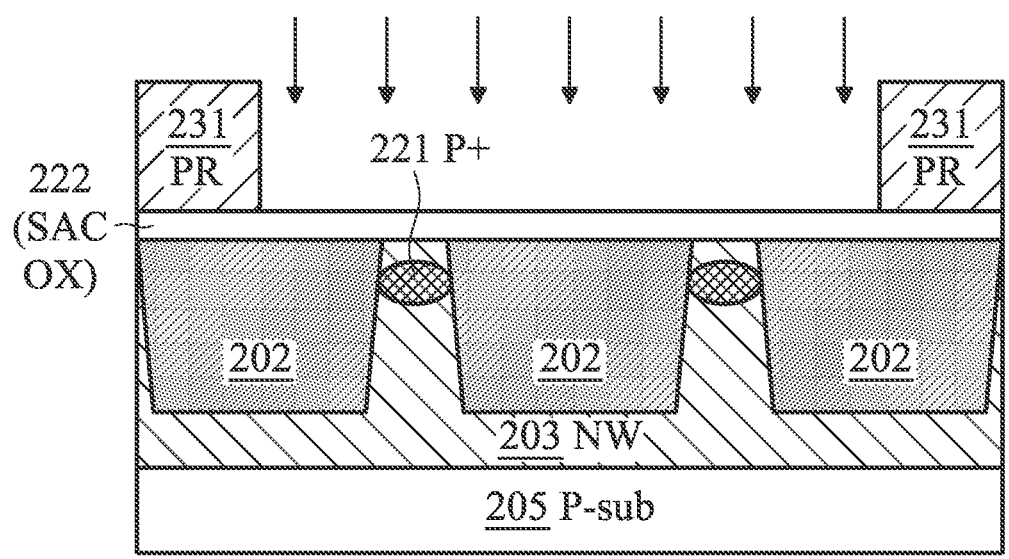

As illustrated in FIG. 3(b), a patterned photoresist 231 may be formed over a partial area of the sacrificial oxide 222, leaving an area surrounded by the STI 202 to be exposed for further processing. The photoresist 231 and any other photoresist used herein, may be any known or later-developed photoresist material. The photoresist 231 may be formed at the same time as the photoresist 131 shown in FIG. 2(b).

Since the photoresist 231 may be formed at the same time as the photoresist 131, the PNP emitter implant 221 may be implanted at the same time as the PNP emitter implant 121 are implanted through the sacrificial oxide layer 122 into an area of the base 103 not covered by the photoresist 131, as shown in FIG. 2(b). The implanted 221 does not function in further steps for forming the polysilicon resistor, therefore the implant 221 will not be shown in FIGS. 3(c)-3(d).

Figure 3C:
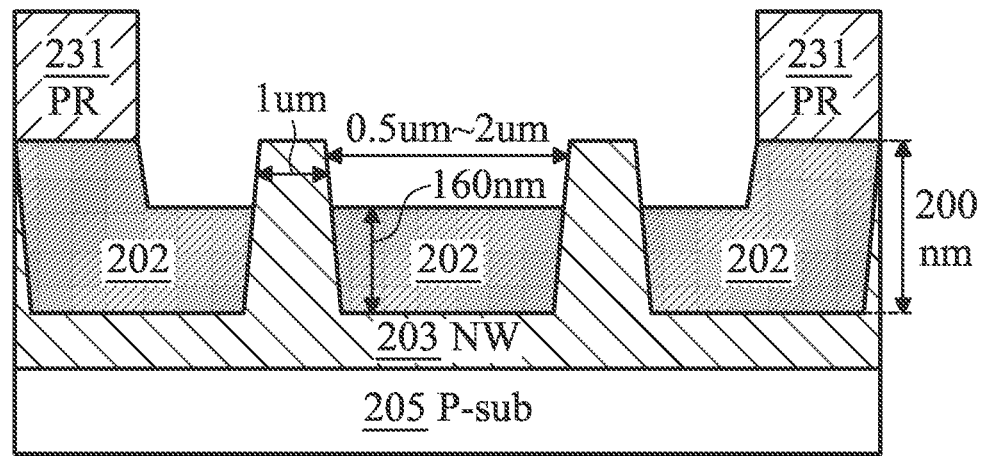

As illustrated in FIG. 3(c), the etching of the STI 202 may be performed, which may be done by a wet etch using a HF:H2O(1:50) solvent. The etching of the STI 202 may be done by dry etching, or a combination of dry etching and wet etching. The width of the STI 202 opening may be in a range about 0.5 um to 2 um. The depth of the STI 202 may be in a range about 200 nm, and the etch depth may be in a range about 40 nm so that the depth of the remaining STI is in a range about 160 nm.

Figure 3D:
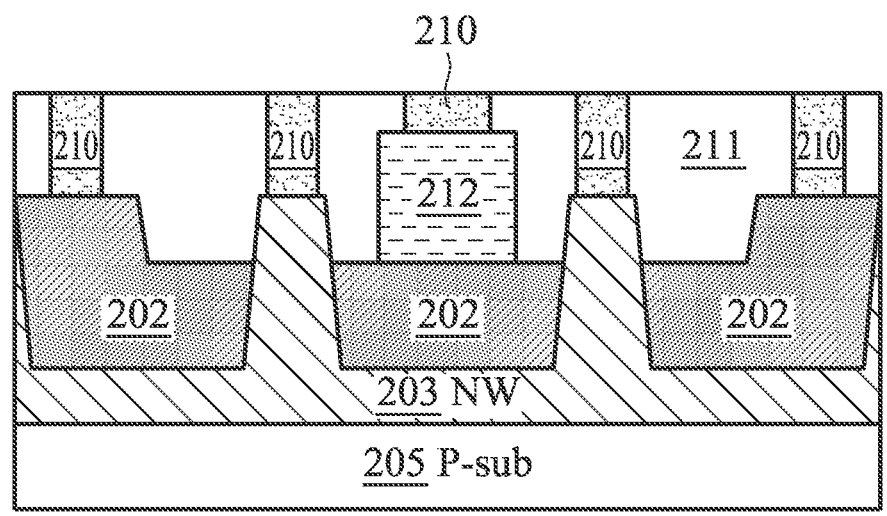

As illustrated in FIG. 3(d), the sacrificial layer 222 may be removed, the photoresist 231 may be removed as well. The photoresist 231 and the sacrificial layer 222 may be removed by a resist-stripping method such as by dry etching, wet etching or a combination thereof.

A polysilicon resistive material 212 may be formed within the etched STI 202. The polysilicon resistive material 212 may be formed utilizing a deposition process and lithography patterning process. The deposition process can include, for example, chemical vapor deposition (CVD), plasma enhanced chemical vapor deposition (PECVD), evaporation, physical vapor deposition (PVD), sputtering, chemical solution deposition, atomic layer deposition (ALD) and other like deposition processes. The lithography can be a DUV and an etching process such as dry etching process in a plasma chamber with the chemical of Cl2 or HBr. The polysilicon resistive material 212 may have a thickness in a range about 10 nm to 100 nm.

An inter-level dielectric (ILD) layer 211 may be formed on the etched STIs, the polysilicon resistive material 212, and the n-well 203. The ILD layer 211 may be made of an ultra-low dielectric constant material, which may be any material having a relatively weak mechanical strength. Furthermore, a plurality of contacts 210 may be formed within the ILD layer 11 connected to the STI 202, the n-well 203, and the polysilicon resistive material 212. The contacts 110 may be formed by steps such as contact etching, NiSi formation, and well plug. The material NiSi or other silicide may be used as an interfacial layer to lower contact resistance.

Thus, according to an embodiment, a bipolar junction transistor (BJT) comprises an emitter disposed in a semiconductor substrate of a first semiconductor material, with the emitter comprising a doped region and a first contact layer of a second semiconductor material disposed on the doped region. A base is disposed under the emitter, with the base having a first base portion extending above a bottom surface of the emitter, the first base portion laterally spaced apart from the emitter. A collector is disposed under the base and extends laterally past edges of the base, and a first isolation structure is disposed between and separates the first base portion and the emitter.

A bipolar junction transistor (BJT) according to some embodiments comprises a collector disposed in a semiconductor substrate and having a first conductivity type. A well is disposed over the collector and has the first conductivity type and a base is disposed over the collector and has a second conductivity type. An emitter is disposed over the base and comprising a doped region of the first conductivity type. A first shallow trench isolation (STI) laterally separates the emitter from a first portion of the base and a second STI laterally separating a portion of the base from the well. A contact is on the base, with the contact comprising a semiconductor material of the second conductivity type.

A method for fabricating a bipolar junction transistor (BJT), comprising providing a semiconductor substrate of a first semiconductor material and comprising a collector, a base on the collector, a well on the collector and having a first conductivity type, and a first shallow trench isolation (STI) in the base. An emitter doped region is formed over the base within the first STI such that the first STI surrounds the emitter doped region, with the STI laterally separating the emitter doped region from a first portion of the base. A contact layer of a second semiconductor material is formed over the semiconductor substrate, the contact layer having a first contact layer portion disposed on the well and a second contact layer portion disposed on the emitter doped region.

Although the present disclosure and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present application, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A bipolar junction transistor (BJT) comprising:
   an emitter disposed in a semiconductor substrate of a first semiconductor material, the emitter comprising:
     a doped region; and
     a first contact layer of a second semiconductor material disposed on the doped region;
   a base disposed under the emitter, the base having a first base portion extending above a bottom surface of the emitter, the first base portion laterally spaced apart from the emitter;
   a collector disposed under the base and extending laterally past edges of the base; and
   a first isolation structure disposed between and separating the first base portion and the emitter.

2. The BJT of claim 1, wherein the second semiconductor material is silicon germanium (SiGe).

3. The BJT of claim 2, wherein the collector is a silicon substrate.

4. The BJT of claim 1, further comprising:
   a well structure disposed over the collector, wherein the first base portion is disposed between the emitter and the collector.

5. The BJT of claim 4, further comprising:
   a second contact layer of the second semiconductor material disposed on the well structure.

6. The BJT of claim 5, further comprising:
   a second isolation structure disposed between the well structure and the first base portion.

7. The BJT of claim 4, further comprising:
   a third contact layer on the base and separated from the first contact layer by the first isolation structure.

8. The BJT of claim 7, wherein the doped region is a p+ doped region;
   wherein the third contact layer is an n+ doped region; and
   wherein the well structure is a p-well structure.

9. A bipolar junction transistor (BJT) comprising:
   a collector disposed in a semiconductor substrate and having a first conductivity type;
   a well disposed over the collector and having the first conductivity type;
   a base disposed over the collector and having a second conductivity type;
   an emitter disposed over the base and comprising a doped region of the first conductivity type;
   a first shallow trench isolation (STI) laterally separating the emitter from a first portion of the base;
   a second STI laterally separating a portion of the base from the well; and
   a contact on the base, the contact comprising a semiconductor material of the second conductivity type.

10. The BJT of claim 9, wherein the first conductivity type is p-type, and wherein the second conductivity type is n-type.

11. The BJT of claim 10, further comprising an n+ contact on the first portion of the base;
    wherein a bottom surface of the n+ contact extends below top surfaces of the first STI and the second STI.

12. The BJT of claim 11, wherein the doped region is a p+ doped region.

13. The BJT of claim 9, further comprising a silicon germanium (SiGe) contact on the well;
    wherein the emitter further comprises an SiGe layer on the doped region.

14. The BJT of claim 9, wherein the first STI encircles the emitter.

15. A method for fabricating a bipolar junction transistor (BJT), comprising:
    providing a semiconductor substrate of a first semiconductor material and comprising a collector, a base on the collector, a well on the collector and having a first conductivity type, and a first shallow trench isolation (STI) in the base;
    forming an emitter doped region over the base within the first STI such that the first STI surrounds the emitter doped region, the STI laterally separating the emitter doped region from a first portion of the base; and
    forming a contact layer of a second semiconductor material over the semiconductor substrate, the contact layer having a first contact layer portion disposed on the well and a second contact layer portion disposed on the emitter doped region.

16. The method of claim 15, wherein the forming an emitter doped region comprises implanting a p-type dopant into the base.

17. The method of claim 15, wherein the forming an emitter doped region further comprises forming a p+ region from the implanted p-type dopant by a rapid thermal diffusion process.

18. The method of claim 15, wherein the semiconductor substrate comprises a second STI disposed between the well and the first portion of the base.

19. The method of claim 18, further comprising etching top surfaces of the well and emitter doped region to below top surfaces of the first STI and second STI before the forming the contact layer.

20. The method of claim 19, wherein the first semiconductor material is silicon;
   wherein the second semiconductor material comprises silicon germanium (SiGe); and
   wherein the forming the contact layer comprises forming a SiGe layer by epitaxy.

\* \* \* \* \*